(12) United States Patent
Chen et al.

(10) Patent No.: US 7,768,274 B2
(45) Date of Patent: Aug. 3, 2010

(54) VOLTAGE TOLERANCE MEASURING APPARATUS FOR MOTHERBOARD

(75) Inventors: Ying Chen, Shenzhen (CN); Jin-Liang Xiong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 455 days.

(21) Appl. No.: 11/946,857

(22) Filed: Nov. 29, 2007

(65) Prior Publication Data

US 2008/0303506 A1 Dec. 11, 2008

(30) Foreign Application Priority Data

Jun. 8, 2007 (CN) .................. 2007 1 0200801

(51) Int. Cl.
*G01R 27/08* (2006.01)
*G01R 31/26* (2006.01)
*H02H 9/00* (2006.01)
(52) U.S. Cl. .................. 324/713; 324/765; 361/52
(58) Field of Classification Search ............. 324/713; 361/52

See application file for complete search history.

(56) References Cited

U.S. PATENT DOCUMENTS

| 4,140,965 | A | 2/1979 | Neal | |
|---|---|---|---|---|
| 7,013,230 | B2 * | 3/2006 | Sekino | 702/117 |
| 7,216,241 | B2 * | 5/2007 | Babb et al. | 713/300 |
| 7,280,334 | B2 * | 10/2007 | Alokby | 361/93.1 |
| 7,312,614 | B2 * | 12/2007 | Peng | 324/538 |
| 7,531,913 | B2 | 5/2009 | Liu | |
| 2008/0151452 | A1 * | 6/2008 | Ren | 361/86 |
| 2008/0151455 | A1 * | 6/2008 | Ren | 361/89 |

FOREIGN PATENT DOCUMENTS

CN 2514406 Y 10/2002
CN 1936773 A 3/2007

* cited by examiner

*Primary Examiner*—Jeff Natalini
(74) *Attorney, Agent, or Firm*—Frank R. Niranjan

(57) ABSTRACT

A voltage tolerance measuring apparatus configured to measure voltage tolerance of a motherboard includes a first connector configured to connect with a power connector of a computer power supply, a second connector configured to connect with a power connector of the motherboard, and a measuring circuit having an adjustable direct current (DC) power supply and a switch circuit. The adjustable DC power supply is connected to power pins of the second connector via the switch circuit. The switch circuit is connected to a power-on pin of the second connector. When the switch circuit receives a power-on signal of the motherboard via the power-on pin of the second connector, the switch circuit controls the adjustable DC power supply to supply power to the power pins of the second connector.

10 Claims, 1 Drawing Sheet

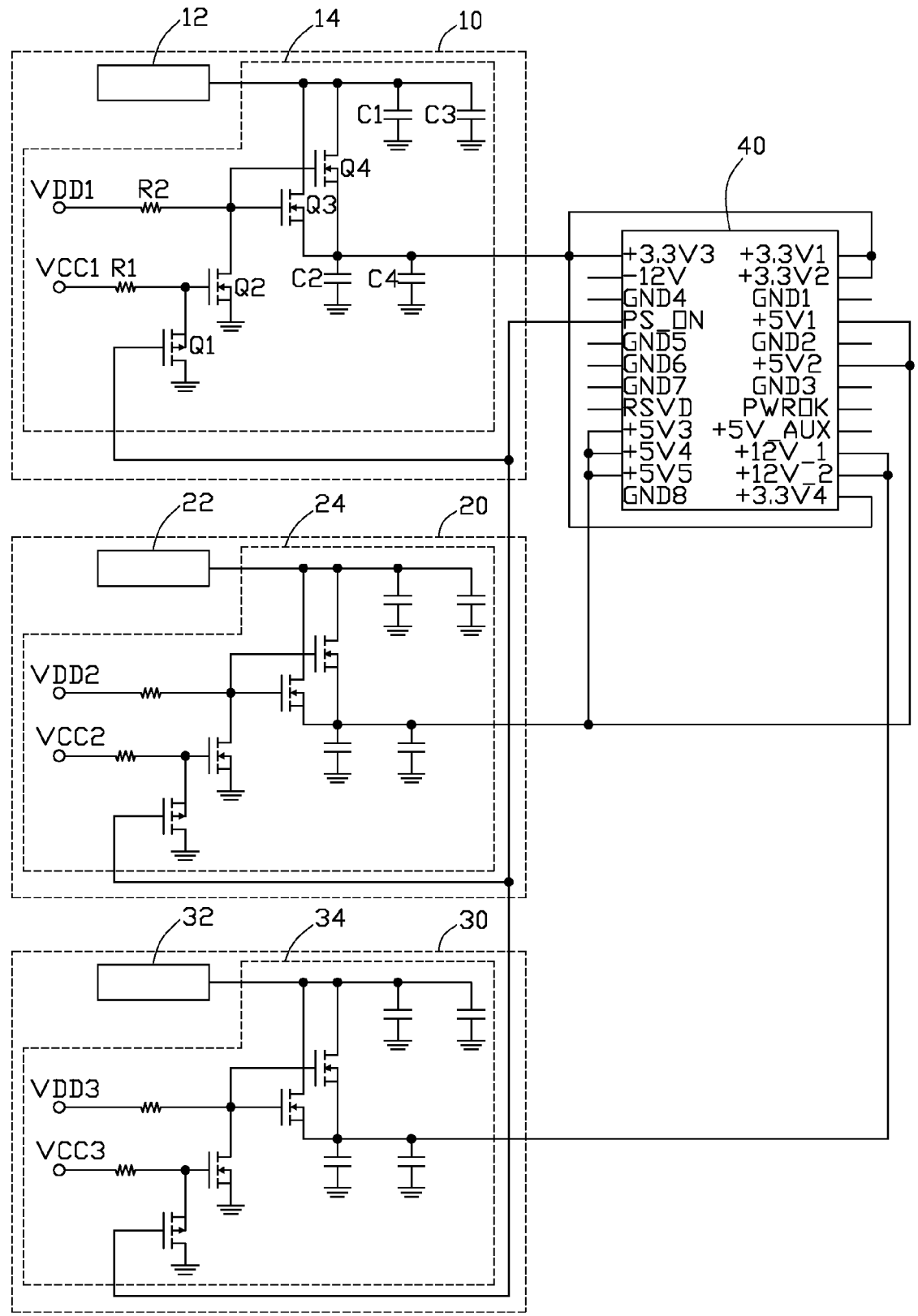

VOLTAGE TOLERANCE MEASURING APPARATUS FOR MOTHERBOARD

BACKGROUND

1. Field of the Invention

The present invention relates to measuring apparatuses, and particularly to a voltage tolerance measuring apparatus which measures the voltage tolerance of a motherboard of a computer.

2. Description of Related Art

Generally speaking, a power system of a motherboard of a computer includes 3.3V_SYS, 12V_SYS, 5V_SYS, −5V_SYS, −12V_SYS, 5V_STBY voltage signals, and PS_ON, PWROK control signals. These voltage and control signals are supplied by a computer power supply via a 24 pin power connector thereof connected to a corresponding 24 pin power connector of the motherboard. Because the computer power supply is a dedicated device for the motherboard, the voltage tolerance of the motherboard should match with the computer power supply. If the voltage of the computer power supply is greater than the voltage tolerance of the motherboard, the motherboard may be damaged. Thereby, the voltage tolerance of the motherboard needs to be measured before selling.

What is needed is to provide a voltage tolerance measuring apparatus to measure the voltage tolerance of a motherboard.

SUMMARY

An embodiment of a voltage tolerance measuring apparatus configured to measure voltage tolerance of a motherboard includes a first connector configured to connect with a power connector of a computer power supply, a second connector configured to connect with a power connector of the motherboard, and a measuring circuit having an adjustable direct current (DC) power supply and a switch circuit. The adjustable DC power supply is connected to power pins of the second connector via the switch circuit. The switch circuit is connected to a power-on pin of the second connector. When the switch circuit receives a power-on signal of the motherboard via the power-on pin of the second connector, the switch circuit controls the adjustable DC power supply to supply power to the power pins of the second connector.

Other advantages and novel features of the present invention will become more apparent from the following detailed description of an embodiment when taken in conjunction with the accompanying drawing, in which:

BRIEF DESCRIPTION OF THE DRAWING

The drawing is a circuit diagram of a voltage tolerance measuring apparatus in accordance with an embodiment of the present invention.

DETAILED DESCRIPTION

Referring to the drawing, a voltage tolerance measuring apparatus in accordance with an embodiment of the present invention is configured to measure voltage tolerance of a motherboard is shown. The voltage tolerance measuring apparatus includes a 3.3V measuring circuit 10, a 5V measuring circuit 20, a 12V measuring circuit 30, a first connector (not shown) configured to connect with a 24 pin power connector of a computer power supply (not shown), and a second connector 40 configured to connect with a 24 pin power connector of the motherboard. The pins except the 3.3V, 5V, and 12V power pins of the first connector and second connector 40 are correspondingly connected together.

In this embodiment, the 3.3V measuring circuit 10 is configured to measure the 3.3V voltage tolerance of the motherboard, the 5V measuring circuit 20 is configured to measure the 5V voltage tolerance of the motherboard, and the 12V measuring circuit 30 is configured to measure the 12V voltage tolerance of the motherboard. The voltage tolerance measuring apparatus can also add similar measuring circuits to measure other specification voltage tolerances of the motherboard.

The 3.3V measuring circuit 10 includes an adjustable direct current (DC) power supply 12 and a switch circuit 14. The switch circuit 14 includes a DC power supply VCC1, a DC power supply VDD1, two pull up resistors R1 and R2, two electrolytic capacitors C1 and C2, two porcelain capacitors C3 and C4, a p-channel transistor Q1, and three n-channel transistors Q2, Q3, and Q4.

The gate of the transistor Q1 is connected to a power-on pin PS_ON of the second connector 40. The drain of the transistor Q1 is grounded. The source of the transistor Q1 is connected to the gate of the transistor Q2 and connected to the DC power supply VCC1 via the resistor R1. The source of the transistor Q2 is grounded. The drain of the transistor Q2 is connected to the gates of the transistors Q3 and Q4, and connected to the DC power supply VDD1 via the resistor R2. The sources of the transistors Q3 and Q4 are connected to the 3.3V power pins of the second connector 40. The drains of the transistors Q3 and Q4 are connected to the adjustable DC power supply 12. The capacitors C1 and C3 are connected between the adjustable DC power supply 12 and ground. The capacitors C2 and C4 are connected between the source of the transistor Q3 and ground. The voltage of the DC power supply VDD1 is greater than 3.3V.

The 5V measuring circuit 20 includes an adjustable DC power supply 22 and a switch circuit 24. The switch circuit 24 is similar to switch circuit 14 except the two DC power supplies VCC1 and VDD1. In the switch circuit 24, the two DC power supplies VCC2 and VDD2 replaced the DC power supplies VCC1 and VDD1 of the switch circuit 14. The gate of the transistor (corresponding to the transistor Q1) of the switch circuit 24 is the power-on pin PS_ON of the second connector 40. The sources of the transistors (corresponding to the transistors Q3 and Q4) are connected to the 5V power pins of the second connector 40. The voltage of the DC power supply VDD2 is greater than 5V.

The 12V measuring circuit 20 includes an adjustable DC power supply 32 and a switch circuit 34. The switch circuit 34 is similar to switch circuit 14 except the two DC power supplies VCC1 and VDD1. In the switch circuit 34, the two DC power supplies VCC3 and VDD3 replaced the DC power supplies VCC1 and VDD1 of the switch circuit 14. The gate of the transistor (corresponding to the transistor Q1) of the switch circuit 34 is the power-on pin PS_ON of the second connector 40. The sources of the transistors (corresponding to the transistors Q3 and Q4) are connected to the 12V power pins of the second connector 40. The voltage of the DC power supply VDD3 is greater than 12V. In this embodiment, the voltages of the DC power supply VDD1, VDD2, and VDD3 are 15V. The voltages of the DC power supply VCC1, VCC2, and VCC3 are 5V.

When measuring the voltage tolerance of the motherboard, the first connector is connected to the 24 pin power connector of the computer power supply, and the second connector 40 is connected to the 24 pin power connector of the motherboard. The voltages of the adjustable DC power supplies 12, 22, and 32 are respectively initialized at 3.3V, 5V, and 12V. Then, the power button of the motherboard is pressed, so that the power-on pin PS_ON of the second connector 40 changes to low level. In the 3.3V measuring circuit 10, the transistor Q1 is turned on, the transistor Q2 is turned off, and the transistors Q3 and Q4 are turned on. Thereby, the adjustable DC power supply 12 supplies power to the 3.3V pin of the second connector 40. And then, the adjustable DC power supply 12 is adjusted manually. As the voltage from the power supply 12 is raised a point is reached where beyond that value the motherboard will not work thus establishing the upper limit of the tolerance of the 3.3V circuit of the motherboard. Similarly, as the voltage from the power supply 12 is lowered a point will be reached beyond which the motherboard will not work, thus establishing the lower limit of the tolerance range of the 3.3V circuit of the motherboard.

After measuring the 3.3V voltage tolerance of the motherboard, the 5V and 12V voltage tolerances of the motherboard also can be measured with the similar method, which is very convenient and efficient.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A voltage tolerance measuring apparatus configured to measure voltage tolerance of a motherboard, comprising:
    a first connector configured to connect with a power connector of a computer power supply;
    a second connector configured to connect with a power connector of the motherboard; and
    a measuring circuit having an adjustable direct current (DC) power supply and a switch circuit, the adjustable DC power supply connected to power pins of the second connector via the switch circuit, the switch circuit connected to a power-on pin of the second connector, when the switch circuit receives a power-on signal of the motherboard via the power-on pin of the second connector, the switch circuit controls the adjustable DC power supply to supply power to the power pins of the second connector.

2. The voltage tolerance measuring apparatus as claimed in claim 1, wherein the switch circuit includes a first DC power supply, a second DC power supply, a first resistor, a second resistor, a first transistor, a second transistor, a third transistor, and a fourth transistor, the gate of the first transistor is connected to the power-on pin of the second connector, the drain of the first transistor is grounded, the source of the first transistor is connected to the gate of the second transistor and connected to the first DC power supply via the first resistor, the source of the second transistor is grounded, the drain of the second transistor is connected to the gates of the third and fourth transistors and connected to the second DC power supply via the second resistor, the sources of the third and fourth transistors are connected to the power pins of the second connector, the drains of the third and fourth transistors are connected to the adjustable DC power supply.

3. The voltage tolerance measuring apparatus as claimed in claim 2, wherein an electrolytic capacitor and a porcelain capacitor are connected between the adjustable DC power supply and ground, an electrolytic capacitor and a porcelain capacitor are connected between the source of the third transistor and ground.

4. The voltage tolerance measuring apparatus as claimed in claim 2, wherein the first transistor is a p-channel transistor, the second, third, and fourth transistors are n-channel transistors.

5. The voltage tolerance measuring apparatus as claimed in claim 1, wherein the measuring circuit is a 3.3V measuring circuit configured to measure the 3.3V voltage tolerance of the motherboard, the power pins of the second connector are 3.3V power pins thereof.

6. The voltage tolerance measuring apparatus as claimed in claim 1, wherein the measuring circuit is a 5V measuring circuit configured to measure the 5V voltage tolerance of the motherboard, the power pins of the second connector are 5V power pins thereof.

7. The voltage tolerance measuring apparatus as claimed in claim 1, wherein the measuring circuit is a 12V measuring circuit configured to measure the 12V voltage tolerance of the motherboard, the power pins of the second connector are 12V power pins thereof.

8. A voltage tolerance measuring apparatus configured to measure voltage tolerance of a motherboard, comprising:
    a first connector configured to connect with a power connector of a computer power supply;
    a second connector configured to connect with a power connector of the motherboard;
    a 3.3V measuring circuit having a first adjustable direct current (DC) power supply and a first switch circuit, the first adjustable DC power supply connected to 3.3 V power pins of the second connector via the first switch circuit, the first switch circuit connected to a power-on pin of the second connector, when the first switch circuit receives a power-on signal of the motherboard via the power-on pin of the second connector, the first switch circuit controls the first adjustable DC power supply to supply power to the 3.3 V power pins of the second connector;
    a 5V measuring circuit having a second adjustable direct current (DC) power supply and a second switch circuit, the second adjustable DC power supply connected to 5V power pins of the second connector via the second switch circuit, the second switch circuit connected to a power-on pin of the second connector, when the second switch circuit receives a power-on signal of the motherboard via the power-on pin of the second connector, the second switch circuit controls the second adjustable DC power supply to supply power to the 5V power pins of the second connector; and
    a 12V measuring circuit having a third adjustable direct current (DC) power supply and a third switch circuit, the third adjustable DC power supply connected to 12V power pins of the second connector via the third switch circuit, the third switch circuit connected to a power-on pin of the second connector, when the third switch circuit receives a power-on signal of the motherboard via the power-on pin of the second connector, the third switch circuit controls the third adjustable DC power supply to supply power to the 12V power pins of the second connector.

9. The voltage tolerance measuring apparatus as claimed in claim 8, wherein each of the switch circuits includes a first DC power supply, a second DC power supply, a first resistor, a second resistor, a first transistor, a second transistor, a third transistor, and a fourth transistor, the gate of the first transistor is connected to the power-on pin of the second connector, the drain of the first transistor is grounded, the source of the first transistor is connected to the gate of the second transistor and connected to the first DC power supply via the first resistor, the source of the second transistor is grounded, the drain of the second transistor is connected to the gates of the third and fourth transistors and connected to the second DC power supply via the second resistor, the sources of the third and fourth transistors are connected to the corresponding power pins of the second connector, the drains of the third and fourth transistors are connected to the corresponding adjustable DC power supply.

10. The voltage tolerance measuring apparatus as claimed in claim 9, wherein the first transistor is a p-channel transistor, the second, third, and fourth transistors are n-channel transistors.

* * * * *